United States Patent
Hong et al.

(10) Patent No.: US 8,877,544 B2
(45) Date of Patent: Nov. 4, 2014

(54) SOLAR CELL AND METHOD OF MANUFACTURING THE SAME

(71) Applicant: Jusung Engineering Co., Ltd., Gwangju-Si (KR)

(72) Inventors: Jin Hong, Yongin-Si (KR); Jae Ho Kim, Yongin-Si (KR); Chang Sil Yang, Suwon-Si (KR)

(73) Assignee: Jusung Engineering Co., Ltd. (KR)

( * ) Notice: Subject to any disclaimer, the term of this patent is extended or adjusted under 35 U.S.C. 154(b) by 0 days.

(21) Appl. No.: 13/750,916

(22) Filed: Jan. 25, 2013

(65) Prior Publication Data

US 2013/0143349 A1    Jun. 6, 2013

Related U.S. Application Data (62) Division of application No. 12/668,420, filed as application No. PCT/KR2008/004061 on Jul. 10, 2008.

(30) Foreign Application Priority Data

Jul. 10, 2007    (KR) .................. 10-2007-0069255

(51) Int. Cl.
| | | |
|---|---|---|
| H01L 31/18 | (2006.01) |
| H01L 31/0236 | (2006.01) |
| H01L 31/075 | (2012.01) |
| H01L 31/052 | (2014.01) |
| H01L 31/20 | (2006.01) |
| H01L 31/0224 | (2006.01) |
| H01L 27/142 | (2014.01) |
| H01L 31/0352 | (2006.01) |
| H01L 31/0216 | (2014.01) |

(52) U.S. Cl.
CPC .......... *H01L 31/18* (2013.01); *H01L 31/02363* (2013.01); *H01L 31/075* (2013.01); *H01L 31/0522* (2013.01); *H01L 31/202* (2013.01); *H01L 31/022433* (2013.01); *H01L 27/1427* (2013.01); *Y02E 10/548* (2013.01); *H01L 31/035281* (2013.01); *Y02E 10/52* (2013.01); *H01L 31/02167* (2013.01)
USPC ............................................. 438/98; 136/265

(58) Field of Classification Search
USPC .............................................. 438/98; 136/265
See application file for complete search history.

(56) References Cited

U.S. PATENT DOCUMENTS

| | | | | |
|---|---|---|---|---|
| 5,603,778 A | * | 2/1997 | Sonoda ........................ | 136/259 |
| 5,770,463 A | * | 6/1998 | Nakagawa et al. ............ | 438/62 |
| 8,455,753 B2 | * | 6/2013 | Nishi et al. ................... | 136/256 |
| 2005/0016582 A1 | | 1/2005 | Lee et al. | |

(Continued)

FOREIGN PATENT DOCUMENTS

| | | |
|---|---|---|
| JP | 2001-102603 | 4/2001 |
| JP | 2004-064042 | 2/2004 |

(Continued)

*Primary Examiner* — Earl Taylor (57) ABSTRACT

In one embodiment, a method of manufacturing a solar cell includes forming a first electrode over a substrate; forming a light-converting layer over the first electrode and patterning the light-converting layer to form a plurality of patterned light-converting layers that are spaced apart from each other; forming a transparent insulating layer over the first electrode including the patterned light-converting layers; and forming a second electrode over the transparent insulating layer.

14 Claims, 4 Drawing Sheets

(56) References Cited

U.S. PATENT DOCUMENTS

| | | | |
|---|---|---|---|
| 2005/0076945 A1* | 4/2005 | Tachibana et al. | 136/244 |
| 2005/0115504 A1* | 6/2005 | Ueda et al. | 118/723 R |
| 2006/0157105 A1* | 7/2006 | Nishi et al. | 136/263 |
| 2007/0068571 A1 | 3/2007 | Li et al. | |
| 2010/0193022 A1* | 8/2010 | Hong et al. | 136/256 |
| 2011/0120553 A1* | 5/2011 | Watai et al. | 136/256 |
| 2011/0284051 A1* | 11/2011 | Miyauchi | 136/244 |
| 2013/0143349 A1* | 6/2013 | Hong et al. | 438/71 |

FOREIGN PATENT DOCUMENTS

| | | |
|---|---|---|
| KR | 10-2002-0061870 | 7/2002 |
| KR | 10-2005-0100806 | 10/2005 |
| KR | 10-2006-0069307 | 6/2006 |
| KR | 1020060100174 | 9/2006 |
| KR | 1020070004593 | 9/2007 |

* cited by examiner

SOLAR CELL AND METHOD OF MANUFACTURING THE SAME

CROSS-REFERENCE TO RELATED APPLICATION

This application is a Divisional Application of U.S. national phase application Ser. No. 12/668,420 filed Jan. 9, 2010, which claims priority to PCT International Application PCT/KR2008/04061, filed Jul. 10, 2008, which claims priority to Korean Patent Application No. 10-2007-0069255, filed Jul. 10, 2007, the contents of which are incorporated herein by reference in their entirety.

TECHNICAL FIELD

The present disclosure relates to a solar cell and a method of manufacturing the same, and more particularly, to a transparent solar cell capable of transmitting light without reducing a light-receiving area and a method of manufacturing the same.

BACKGROUND ART

Recently, with the increase in concern about environmental problems and energy depletion, a solar cell is attracting an increasing attention as an alternative energy source that has abundant energy resources, has no environmental pollution problem, and has high energy efficiency. Solar cells can be classified into a solar heat cell and a solar light cell. The solar heat cell uses solar heat to generate steam necessary for rotating a turbine. The solar light cell uses semiconductor materials to convert solar light into electrical energy.

The solar light cell can be generally classified into a crystalline silicon solar cell and a thin film solar cell. The crystalline silicon solar cell includes a polycrystalline silicon solar cell and a single crystalline silicon solar cell. The thin film solar cell includes an amorphous silicon solar cell. However, since the crystalline silicon solar cell is manufactured using an expensive thick silicon substrate, the crystalline silicon solar cell has a limitation in reducing its thickness. Furthermore, since the silicon substrate is expensive, a price of the crystalline silicon solar cell becomes high.

What is thus being in the spotlight is the amorphous silicon solar cell that can be manufactured at a lot cost because it uses an inexpensive substrate such as a glass substrate and a metal substrate instead of an expensive silicon substrate and minimizes material consumption by depositing a thin film of several microns.

In comparison with the single crystalline silicon substrate or the polycrystalline silicon substrate, an amorphous-silicon thin film has a very short carrier diffusion length due to its inherent characteristics. Therefore, when forming a PN structure using the amorphous-silicon thin film, the efficiency of collecting electron-hole pairs may be very low. Thus, the amorphous silicon solar cell uses a light-converting layer of a PIN structure that has a highly-doped p-type amorphous silicon layer, a highly-doped n-type amorphous silicon layer, and an undoped i-type amorphous silicon layer inserted between the highly-doped p-type amorphous silicon layer and the highly-doped n-type amorphous silicon layer, and the amorphous silicon solar cell generally includes a first electrode, a PIN light-converting layer, and a second electrode, which are sequentially stacked over a substrate.

Figure 1:
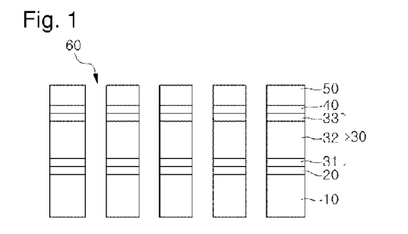
FIG. 1 is a cross-sectional view of a related art transparent solar cell.
Figure 2:
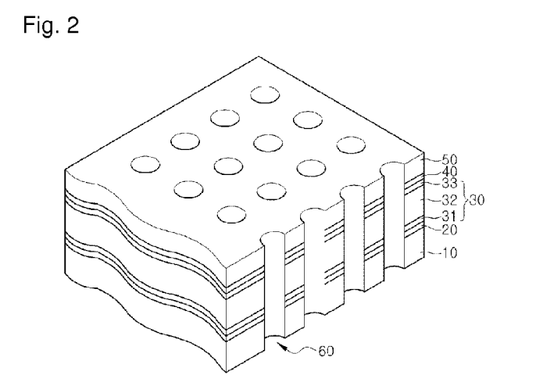
FIG. 2 is a cutaway perspective view of the related art transparent solar cell.

However, even when the amorphous silicon solar cell uses a transparent glass substrate, it fails to transmit light incident from the glass substrate since the amorphous silicon solar cell becomes opaque by the PIN light-converting layer and the electrodes are formed over the glass substrate. What is thus manufactured is a transparent solar cell as illustrated in FIGS. 1 and 2. As illustrated in FIGS. 1 and 2, a related art transparent solar cell includes a first electrode 20, a light-converting layer 30, an insulating layer 40, and a second electrode 50 that are stacked over a transparent substrate 10, and has a through hole 60 formed from the substrate 10 to a pre-determined region of the second electrode 50, thus transmitting light from the bottom of the transparent substrate 10 via the through hole 60. The light-converting layer 30 includes a stack of a p-type amorphous silicon layer 31, an i-type amorphous silicon layer 32, and an n-type amorphous silicon layer 33.

However, when the through hole 60 is formed from the bottom of the transparent substrate 10 to the predetermined region of the second substrate 50, the light-absorbing area is reduced and thus the efficiency of the solar cell is deteriorated.

DETAILED DESCRIPTION

Technical Problem

The present disclosure provides a transparent solar cell capable of transmitting light without deteriorating the efficiency thereof by not reducing a light-receiving area, and a method of manufacturing the same.

The present disclosure also provides a transparent solar cell capable of transmitting light without reducing a light-receiving area, and a method of manufacturing the same. To this end, light-converting layers are patterned, a transparent insulating layer is formed thinly, and an electrode is formed, so that light can penetrate between the light-converting layers and light can be incident also onto the sides of the light-converting layers.

Technical Solution

In accordance with one aspect of the present invention, a solar cell includes: a transparent substrate; a first electrode and a transparent insulating layer that are sequentially stacked over a plurality of first regions of the transparent substrate; and a first electrode, a light-converting layer, a transparent insulating layer, and a second electrode that are sequentially stacked over a second region of the transparent substrate other than the first regions.

In accordance with another aspect of the present invention, a solar cell includes: a transparent substrate; a first electrode, a transparent insulating layer, and a second electrode that are sequentially stacked over a plurality of first regions of the transparent substrate; and a first electrode, a light-converting layer, a transparent insulating layer, and a second electrode that are sequentially stacked over a second region of the transparent substrate other than the first regions.

The first electrode may be formed of transparent conductive materials.

The light-converting layer may include a stack structure of a first semiconductor layer that is doped with first impurities, a second semiconductor layer that is not doped with impurities, and a third semiconductor layer that is doped with second impurities.

The transparent insulating layer may include a ZnO layer.

The ZnO transparent insulating layer may be formed to a thickness that provides the ZnO layer with tunneling and insulating characteristics.

The ZnO transparent insulating layer may be formed to a thickness of approximately 1000 Å or less.

In accordance with still another aspect of the present invention, a method of manufacturing a solar cell includes: forming a first electrode over a substrate; forming a light-converting layer over the first electrode and patterning the light-converting layer to form a plurality of patterned light-converting layers spaced apart from each other; forming a transparent insulating layer over the first electrode including the patterned light-converting layers; and forming a second electrode over the transparent insulating layer.

The light-converting layer may be patterned by a dry etching process using a gas obtained by mixing one of $NF_3$, $SF_6$, HBr, $Cl_2$, $BCl_3$ and a combination thereof with one of Ar, $O_2$, He, $N_2$ and a combination thereof.

The transparent insulating layer may be formed by depositing ZnO using a metal-organic chemical vapor deposition (MOCVD) process or a sputtering process.

The second electrode may be formed of silver to a thickness of approximately 500 Å or less using a sputtering process.

The second electrode may be formed of aluminum over the transparent insulating layer that is formed over the light-converting layer such that that the second electrode has a smaller pattern than the patterned light-converting layer.

Advantageous Effects

As described above, the present invention forms the plurality of light-converting layers spaced apart from each other, forms the transparent insulating layer, and then forms the second electrode. Therefore, light incident from the substrate can penetrate between the light-converting layers, thus manufacturing a transparent solar cell. Also, since light scattered by the transparent insulating layer is incident also onto the sides of the light-converting layers, the light-receiving area is not reduced and thus the efficiency of the solar cell is increased.

BEST MODE

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 3:
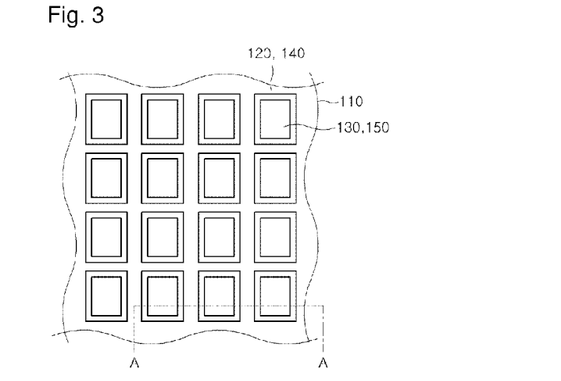
FIG. 3 is a plan view of a solar cell in accordance with a first embodiment of the present invention.
Figure 4:
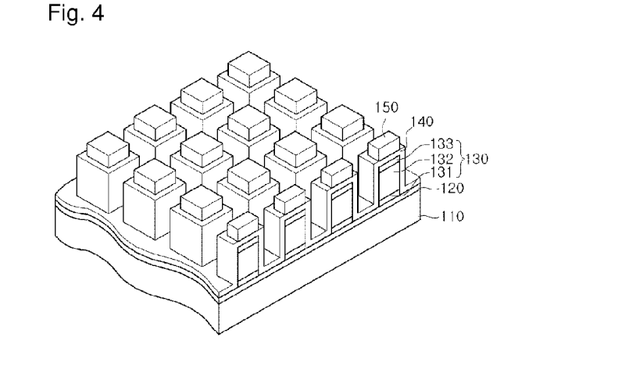
FIG. 4 is a cutaway perspective view of the solar cell in accordance with the first embodiment of the present invention.
Figure 5:
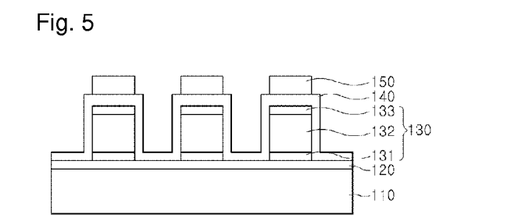
FIG. 5 is a cross-sectional view of the solar cell in accordance with the first embodiment of the present invention.

FIG. 3 is a plan view of a solar cell in accordance with a first embodiment of the present invention. FIG. 4 is a cutaway perspective view of the solar cell in accordance with the first embodiment of the present invention. FIG. 5 is a cross-sectional view taken along a line A-A' of FIG. 3.

Referring to FIGS. 3 to 5, a first electrode 120 is formed over a substrate 110, and a plurality of light-converting layers 130 are formed over the first electrode 120 in such a way that they are spaced apart from each other. Also, a transparent insulating layer 140 is formed over a resulting structure including the light-converting layers 130, and a second electrode 150 is formed over the transparent insulating layer 140 that is formed over the light-converting layer 130.

The substrate 110 may be a transparent substrate. Examples of the transparent substrate are a plate-shaped substrate and a sheet-shaped substrate that are formed of glass or transparent resin. A fine irregular structure may be formed in a surface of the substrate 110. The fine irregular surface structure of the substrate 110 can increase the absorption of incident light.

The first electrode 120 may be formed of transparent conductive materials such as indium tin oxide (ITO) and indium zinc oxide (IZO). Also, the first electrode 120 may have a fine irregular structure formed in a surface thereof.

The light-converting layer 130 is formed in plurality spaced apart from each other. Each of the light-converting layers 130 includes a plurality of semiconductor layers. For example, each of the light-converting layers 130 includes a stack of a p-type amorphous silicon layer 131, an i-type amorphous silicon layer 132, and an n-type amorphous silicon layer 133. Herein, the p-type amorphous silicon layer 131 is a layer that is doped with p-type impurities, the i-type amorphous silicon layer 132 is a layer that is not doped with impurities, and the n-type amorphous silicon layer 133 is a layer that is doped with n-type impurities. For example, the p-type amorphous silicon layer 131 is formed using $B_2H_6$ gas and $SiH_4$ gas, the i-type amorphous silicon layer 132 is formed using $H_2$ gas and $SiH_4$ gas, and the n-type amorphous silicon layer 133 is formed using $PH_3$ gas and $SiH_4$ gas. Also, the p-type amorphous silicon layer 131 is formed to a thickness of approximately 100 Å to approximately 200 Å, the i-type amorphous silicon layer 132 is formed to a thickness of approximately 4000 Å to approximately 5000 Å and the n-type amorphous silicon layer 133 is formed to a thickness of approximately 500 Å to approximately 700 Å. When light is incident on the i-type amorphous silicon layer 132 of the light-converting layer 130, each of stable electron-hole pairs in the i-type amorphous silicon layer 132 is discomposed by photons to generate an electron and a hole. The generated electron and the hole are respectively transferred through the n-type amorphous silicon layer 133 and the p-type amorphous silicon layer 131 to the second electrode 150 and the first electrode 120. The transfer of the electron and the hole generates photovoltaic power that becomes the electrical energy of the solar cell.

The transparent insulating layer 140 is formed over the resulting structure including the light-converting layers 130. Thus, the transparent insulating layer 140 is also formed over the sidewalls of the light-converting layers 130 to insulate the light-converting layers 130. The transparent insulating layer 140 may be formed to a thickness that allows the tunneling of electrons passing through the n-type amorphous silicon layer 133. For example, the transparent insulating layer 140 may include a ZnO layer. The ZnO layer is an n-type semiconductor material when not doped with impurities, and has insulating characteristics when having a small thickness of approximately 1000 Å or less. Thus, using the ZnO layer, the transparent insulating layer 140 is formed to a thickness of approximately 1000 Å or less, which can allow the tunneling and have insulating characteristics.

The second electrode 150 is formed in a smaller pattern than the light-converting layer 130, over the transparent insulating layer 140 that is formed over the light-converting layer 130. The received light quantity increases as the second electrode 150 is formed smaller than the light-converting layer 130. The second electrode 150 is formed in plurality spaced apart from each other. The second electrode 150 is formed mainly of metal, for example, aluminum (Al).

The solar cell in accordance with the first embodiment includes: a plurality of first regions where the first electrode 120 and the transparent insulating layer 140 are stacked over the substrate 110; and a plurality of second regions where the first electrode 120, the light-converting layer 130, the transparent insulating layer 140, and the second electrode 150 are stacked over the substrate 110. The solar cell can transmit light incident from the bottom surface of the substrate 110 through the first region, so that it possible to embody a transparent solar cell. Herein, the distance between the first electrode 120 and the second electrode 150 in the first region is greater than the distance between the first electrode 120 and the second electrode 150 in the second region. Also, since incident light is scattered by the transparent insulating layer 140 and thus light is absorbed also onto the side of the light-converting layer 130, the light-receiving area is not reduced and thus it possible to increase the efficiency of the solar cell.

Figure 6:
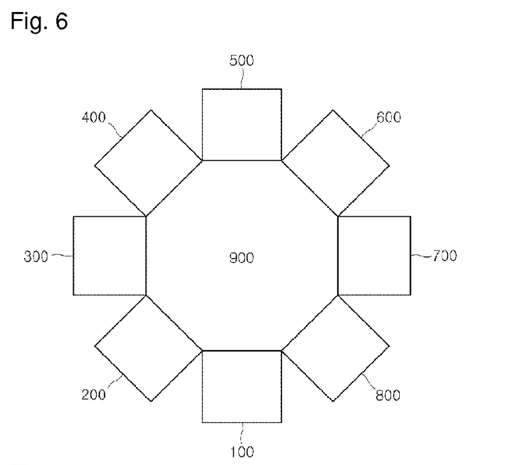
FIG. 6 is a block diagram of a cluster used to manufacture the solar cell in accordance with the first embodiment of the present invention.

FIG. 6 is a block diagram of a cluster equipment used to manufacture the solar cell in accordance with the first embodiment of the present invention.

Referring to FIG. 6, the cluster equipment includes a load-lock chamber 100, first to seventh process chambers 200 to 800, and a transfer chamber 900. The first process chamber 200 is used to form the first electrode 120 and may be configured to include a plasma-enhanced chemical vapor deposition (PECVD) chamber. The second to fourth process chambers 300 to 500 are used to sequentially form the p-type amorphous silicon layer 131, the i-type amorphous silicon layer 132, and the n-type amorphous silicon layer 133 that constitute the light-converting layer 130. For example, each of the second to fourth process chambers 300 to 500 is configured to include a PECVD chamber. The fifth process chamber 600 is used to etch the light-converting layer 130 in a predetermined pattern and may be configured to include a dry etching chamber. The sixth process chamber 700 is used to form the transparent insulating layer 140 and may be configured to include a metal-organic chemical vapor deposition (MOCVD) chamber. The seventh process chamber 800 is used to form the second electrode 150 and may be configured to include a PECVD chamber or a sputtering chamber. The transfer chamber 900 is used to transfer a wafer from each chamber to the next chamber.

The cluster equipment may change in configuration. For example, although it has been described that the light-converting layer 130 is formed using the second, third and fourth process chambers 300, 400 and 500, the light-converting layer 130 may be formed by using one of the second, third and fourth process chambers 300, 400 and 500 and controlling process gas that flows into the process chamber. Also, the chambers may change in arrangement. Also, the cluster equipment may further include: a deposition device for depositing a photoresist layer; an exposure/development device for patterning the photoresist layer; an ashing device for removing the photoresist layer; and a cleaning device.

FIGS. 7 to 10 are cross-sectional views illustrating a method of manufacturing the solar cell in accordance with the first embodiment by using the cluster equipment of FIG. 6. FIGS. 7 to 10 are cross-sectional views taken along the line A-A' of FIG. 3.

Figure 7:
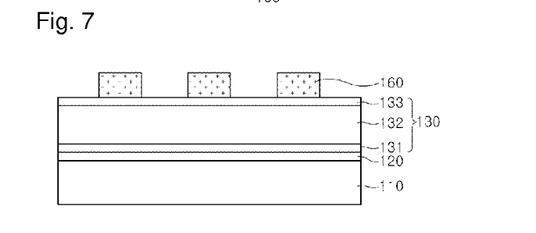
FIGS. 7 to 10 are cross-sectional views illustrating a method of manufacturing the solar cell in accordance with the first embodiment of the present invention.

Referring to FIG. 7, the transparent substrate 110 formed of glass or transparent resin is loaded into the load-lock chamber 100, and the load-lock chamber 100 loaded with the transparent substrate 110 is loaded into the first process chamber 200. In the first process chamber 200, transparent conductive material such as indium tin oxide (ITO) and indium zinc oxide (IZO) is formed over the transparent substrate 110, thereby forming the first electrode 120 over the transparent substrate 110. Herein, the transparent substrate 110 or the first electrode 120 may have a fine irregular structure formed in a surface thereof. The fine irregular structure may be formed performing a plasma-based dry etching process, a mechanical scribing process, or a wet etching process. When the fine irregular structure is formed, light is bounded against the surface of the fine irregular structure two or more times, thus making it possible to reduce the light reflection and increase the light absorption. Also, the fine irregular structure is formed in the transparent substrate 110 and then the first electrode 120 is formed along the irregular structure of the transparent substrate 110, so that both of the transparent substrate 110 and the first electrode 120 can have the irregular structure. Using the transfer chamber 900, the transparent substrate 110 having the first electrode 120 formed thereon is sequentially loaded into the second, third and fourth process chambers 300, 400 and 500, thereby forming the light-converting layer 130, which includes the stack of the p-type amorphous silicon layer 131, the i-type amorphous silicon layer 132, and the n-type amorphous silicon layer 133, over the first electrode 120. For example, the light-converting layer 130 is formed using a PECVD chamber. Herein, the light-converting layer 130 may be formed by providing the second, third and fourth process chambers 300, 400 and 500 with a substrate temperature of approximately 200° C. to approximately 400° C., a high-frequency power of approximately 20 W to approximately 150 W having a frequency of approximately 13.56 MHz, and a pressure of approximately 0.5 torr to approximately 0.9 torr. For example, the p-type amorphous silicon layer 131 may be formed to a thickness of approximately 100 Å to approximately 200 Å using $B_2H_6$ gas of 1% with respect to $SiH_4$ gas. The i-type amorphous silicon layer 132 may be formed to a thickness of approximately 4000 Å to approximately 5000 Å using $SiH_4$ gas and $H_2$ gas. The n-type amorphous silicon layer 133 may be formed to a thickness of approximately 500 Å to approximately 700 Å using $PH_3$ gas of 1% with respect to $SiH_4$ gas. Thereafter, a photoresist pattern 160 exposing a predetermined region of the light-converting layer 130 is formed on the light-converting layer 130. The photoresist pattern 160 may be formed by forming a photoresist layer and performing an exposure/development process on the photoresist layer by means of a certain mask. Alternatively, the photoresist pattern 160 may be formed performing a screen printing process. The photoresist pattern 160 may be formed to be of a polygonal shape such as a circular shape or tetragonal shape.

Figure 8:
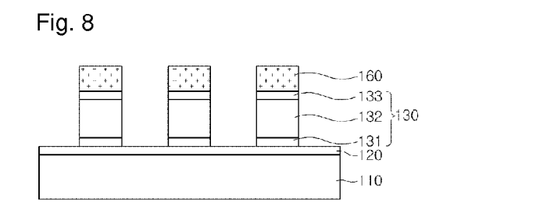

Referring to FIG. 8, in the fifth process chamber 600, the exposed region of the light-converting layer 130 is etched to expose the first electrode 120 using the photoresist pattern 160 as a mask. Thus, a plurality of circular or polygonal light-converting layers 130 are formed to be spaced apart from each other. Herein, the etching process using the fifth process chamber 600 may be a dry etching process performed using a capacitively coupled plasma (CCP) dry etching device or a capacitively coupled plasma (ICP) dry etching device. Herein, the etching gas may be obtained by mixing one of $NF_3$, $SF_6$, HBr, $Cl_2$, $BCl_3$ and a combination thereof with one of Ar, $O_2$, He, $N_2$ and a combination thereof.

Figure 9:
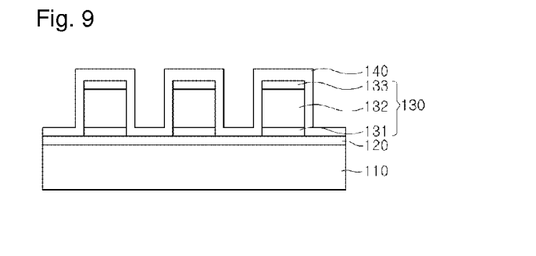

Referring to FIG. 9, an ashing process is performed to remove the photoresist pattern 160, and then a cleaning process is performed on the resulting structure. Thereafter, in the sixth process chamber 700, the transparent insulating layer 140 is formed over the entire surface of the resulting structure. For example, the transparent insulating layer 140 is formed of an undoped ZnO layer to a thickness of approximately 1000 .ANG. or less that can provide the transparent insulating layer 140 with insulating characteristics and tunneling. Also, the transparent insulating layer 140 may be formed performing an MOCVD process.

Figure 10:
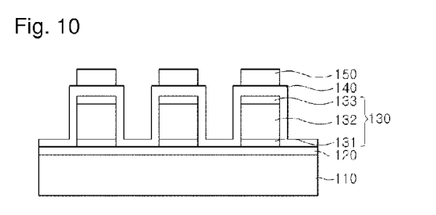

Referring to FIG. 10, in the seventh process chamber 800, a metal layer is formed over the entire surface of the resulting structure. For example, the metal layer is formed of aluminum by performing a sputtering process or a PECVD process. The metal layer may be formed to a thickness of approximately 1000 .ANG. Thereafter, a photolithography process using a mask for patterning the light-converting layer 130 is performed to pattern the metal layer, thereby forming the second electrode 150. Alternatively, a screen printing process is performed to form a photoresist pattern (not shown), and the photoresist pattern is used as a mask to etch the metal layer, thereby forming the second electrode 150. Herein, the second electrode 150 may be formed by forming a metal layer using a metal shadow mask. Thus, the second electrode 150 having the same pattern as the light-converting layer 130 is formed over the transparent insulating layer 140 that is formed over the light-converting layer 130.

It has been described that the light-converting layer 130 is formed using the second, third and fourth process chambers 300, 400 and 500. However, the layers constituting the light-converting layer 130 may be continuously formed by using one of the second, third and fourth process chambers 300, 400 and 500 and controlling process gas that flows into the process chamber. Also, if a PECVD chamber is used as the seventh process chamber 800 in which the metal layer is formed, the seventh process chamber 800 may be replaced with the process chamber used to form the light-converting layer 130.

Figure 11:
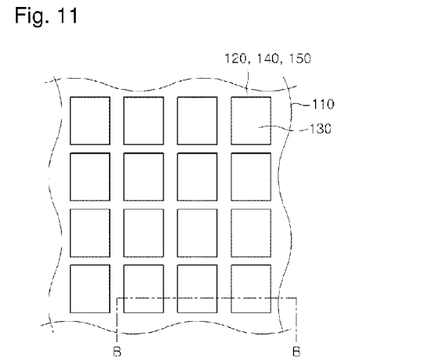
FIG. 11 is a plan view of a solar cell in accordance with a second embodiment of the present invention.
Figure 12:
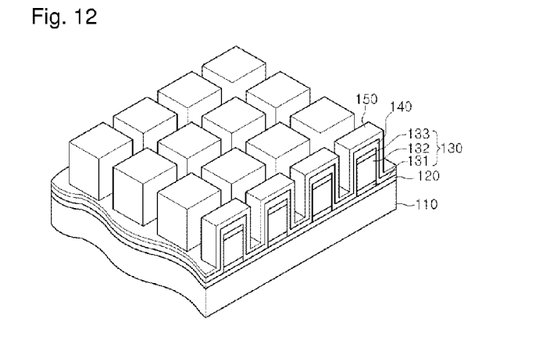
FIG. 12 is a cutaway perspective view of the solar cell in accordance with the second embodiment of the present invention.
Figure 13:
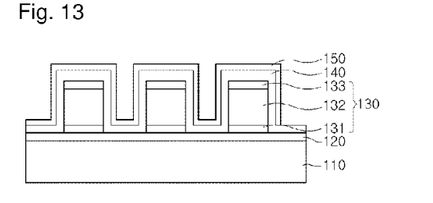
FIG. 13 is a cross-sectional view of the solar cell in accordance with the second embodiment of the present invention.

FIG. 11 is a plan view of a solar cell in accordance with a second embodiment of the present invention. FIG. 12 is a cutaway perspective view of the solar cell in accordance with the second embodiment. FIG. 13 is a cross-sectional view taken along a line B-B' of FIG. 11. A description of an overlap between the present embodiment of FIGS. 11 to 13 and the above-described embodiment of FIGS. 3 to 5 will be omitted for the simplicity of explanation.

Referring to FIGS. 11 to 13, a first electrode 120 is formed over a substrate 110, and a plurality of light-converting layers 130 are formed over the first electrode 120 in such a way that they are spaced apart from each other. Then, a transparent insulating layer 140 is formed over an entire surface of a resulting structure including the light-converting layers 130, and a second electrode 150 is formed over the transparent insulating layer 140.

The substrate 110 may be a transparent substrate that is formed of glass or transparent resin. The substrate 110 may have a fine irregular structure formed in a surface thereof, thus increasing the absorption of incident light.

The first electrode 120 may be formed of transparent conductive materials such as indium tin oxide (ITO) and indium zinc oxide (IZO). Also, the first electrode 120 may have a fine irregular structure formed in a surface thereof.

The light-converting layer 130 is formed in plurality spaced apart from each other. Each of the light-converting layers 130 includes the stack of the p-type amorphous silicon layer 131 that is doped with p-type impurities, the i-type amorphous silicon layer 132 that is not doped with impurities, and the n-type amorphous silicon layer 133 that is doped with n-type impurities.

The transparent insulating layer 140 is formed on the entire surface of the region including the light-converting layers 130. For example, the transparent insulating layer 140 is formed using a ZnO layer to a thickness of approximately 1000 .ANG. or less that can allow a tunneling operation and insulating characteristics.

The second electrode 150 is formed to cover the transparent insulating layer 140. For example, the second electrode 150 is formed of silver (Ag) to a thickness of approximately 500 .ANG. or less. In this case, the second electrode 150 can transmit light while serving as an electrode.

As described above, the solar cell in accordance with the second embodiment includes: a plurality of first regions where the first electrode 120, the transparent insulating layer 140, and the second electrode 150 are stacked over the substrate 110; and a plurality of second regions where the first electrode 120, the light-converting layer 130, the transparent insulating layer 140, and the second electrode 150 are stacked over the substrate 110. The solar cell can transmit light incident from the bottom surface of the substrate 110 through the first region, thus making it possible to embody a transparent solar cell that can transmit light. Herein, the distance between the first electrode 120 and the second electrode 150 in the first region is greater than the distance between the first electrode 120 and the second electrode 150 in the second region. Also, incident light is scattered by the transparent insulating layer 140 and thus light is also absorbed onto the side of the light-converting layer 130. Therefore, the light-receiving area is not reduced, resulting in increasing the efficiency of the solar cell.

FIGS. 14 to 17 are cross-sectional views illustrating a method of manufacturing the solar cell in accordance with the second embodiment. An overlapped description between the second embodiment of FIGS. 14 to 17 and the first embodiment of FIGS. 7 to 10 will be omitted for the simplicity of explanation.

Figure 14:
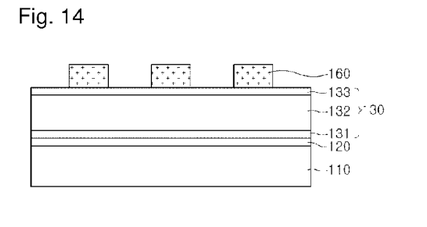
FIGS. 14 to 17 are cross-sectional views illustrating a method of manufacturing the solar cell in accordance with the second embodiment of the present invention.

Referring to FIG. 14, transparent conductive materials such as indium tin oxide (ITO) and indium zinc oxide (IZO) are deposited over the transparent substrate 110 formed of glass or transparent resin, thereby forming the first electrode 120. Herein, the transparent substrate 110 and/or the first electrode 120 may have a fine irregular structure formed in a surface thereof. The light-converting layer 130, i.e., the stack of the p-type amorphous silicon layer 131, the i-type amorphous silicon layer 132, and the n-type amorphous silicon layer 133, is formed over the first electrode 120. A photoresist pattern 160 exposing a predetermined region of the light-converting layer 130 is formed on the light-converting layer 130. The photoresist pattern 160 may be formed to be of a polygonal shape such as a circular shape or a tetragonal shape.

Figure 15:
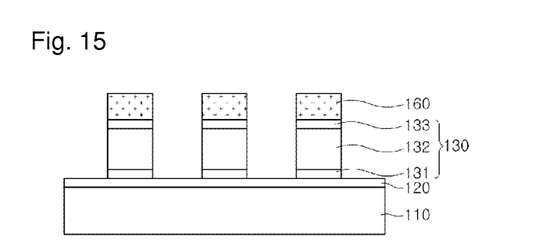

Referring to FIG. 15, the exposed region of the light-converting layer 130 is etched to expose the first electrode 120 using the photoresist pattern 160 as a mask. Thus, a plurality of circular or polygonal light-converting layers 130 are formed to be spaced apart from each other. Herein, the etching process may be a dry etching process that is performed using, e.g., a capacitively coupled plasma (CCP) dry etching device or a capacitively coupled plasma (ICP) dry etching device. Herein, the etching gas may be obtained by mixing one of $NF_3$, $SF_6$, HBr, $Cl_2$, $BCl_3$ and a combination thereof with one of Ar, $O_2$, He, $N_2$ and a combination thereof.

Figure 16:
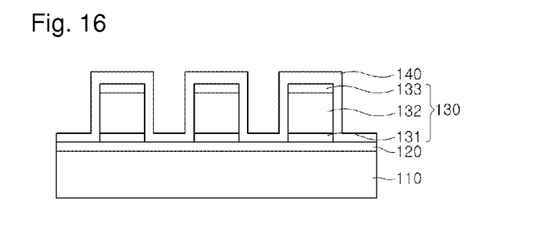

Referring to FIG. 16, an ashing process is performed to remove the photoresist pattern 160. Thereafter, the transparent insulating layer 140 is formed over an entire surface of the resulting structure. For example, the transparent insulating layer 140 is formed of an undoped ZnO layer to a thickness of approximately 1000 Å or less that can provide the transparent insulating layer 140 with insulating characteristics and tunneling.

Figure 17:
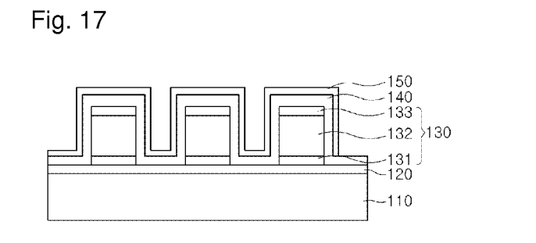

Referring to FIG. 17, a sputtering process is performed to form a metal layer, e.g., an Ag layer over an entire surface of the resulting structure including the transparent insulating layer 140, thereby forming the second electrode 150. For example, the Ag layer is formed to a thickness of approximately 500 Å or less that can make the second electrode 150 transmit light while serving as an electrode.

Although the solar cell and the method of manufacturing the same have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A method of manufacturing a solar cell, the method comprising:
    forming a first electrode over a substrate;
    forming a light-converting layer over the first electrode and patterning the light-converting layer to form a plurality of patterned light-converting layers that are spaced apart from each other;
    forming a transparent insulating layer; and
    forming a second electrode layer over the transparent insulating layer and patterning the second electrode layer to form the second electrode;
    wherein after forming the second electrode, the transparent insulating layer extends from a top surface of the patterned light-converting layers to the first electrode along a plurality of outer sidewalls of the patterned light-converting layers.

2. The method of claim 1, wherein the transparent insulating layer is formed by depositing ZnO using a MOCVD (Metal-Organic Chemical Vapor Deposition) process or a sputtering process.

3. The method of claim 1, wherein the second electrode is formed of a metallic material using a PECVD (Plasma-Enhanced Chemical Vapor Deposition) process or sputtering process, and formed to have a thickness capable of transmitting light and functioning as an electrode.

4. The method of claim 3, wherein the second electrode is formed using silver or aluminum such that the second electrode has a smaller pattern than the patterned light-converting layer.

5. The method of claim 1, wherein the first electrode, the light-converting layer, the transparent insulating layer and the second electrode are formed in separate chambers, respectively, or continuously formed in the same chamber by controlling input gas.

6. The method of claim 5, wherein the same chamber is a PECVD (Plasma-Enhanced Chemical Vapor Deposition) chamber.

7. The method of claim 1, wherein the transparent insulating layer is continuously formed over an upper surface and the sidewalls of the patterned light-converting layers which are spaced apart from each other.

8. The method of claim 1, wherein light incident onto the sidewalls of the patterned light-converting layers is received to the solar cell.

9. The method of claim 8, further comprising forming an insulating layer over the sidewalls of the patterned light-converting layers to scatter the incident light such that the light is absorbed to the sidewalls of the patterned light-converting layers.

10. The method of claim 1, wherein forming the second electrode comprises forming the second electrode extending from a top surface of the transparent insulating layer along outer sidewalls of the transparent insulating layer to a portion of the transparent insulating layer adjacent the first electrode.

11. The method of claim 1, wherein forming the second electrode over the transparent insulating layer comprises patterning the second electrode layer without patterning the transparent insulating layer to form the second electrode.

12. A method of manufacturing a solar cell, the method comprising:
    forming a first electrode over a substrate;
    forming a light-converting layer over the first electrode and patterning the light-converting layer to form a plurality of patterned light-converting layers that are spaced apart from each other;
    forming a transparent insulating layer extending from a top surface of the patterned light-converting layers to the first electrode along a plurality of outer sidewalls of the patterned light-converting layers; and
    forming a second electrode over the transparent insulating layer such that the second electrode is continuously formed over multiple patterned light converting layers of the plurality of patterned light converting layers and extends along outer sidewalls of the transparent insulating layer.

13. The method of claim 12, wherein the multiple patterned light converting layers include patterned light converting layers of the plurality of patterned light converting layers disposed in multiple rows and columns.

14. A method of manufacturing a solar cell, the method comprising:
    forming a first electrode over a substrate;
    forming a light-converting layer over the first electrode and patterning the light-converting layer to form a plurality of patterned light-converting layers that are spaced apart from each other;
    forming a transparent insulating layer extending from a top surface of the patterned light-converting layers to the first electrode along a plurality of outer sidewalls of the patterned light-converting layers such that portions of the transparent insulating layer on opposing outer sidewalls of adjacent patterned light-converting layers are spaced apart; and forming a second electrode over the transparent insulating layer.

* * * * *